United States Patent [19]

Friedhelm

[11] Patent Number: 4,786,760
[45] Date of Patent: Nov. 22, 1988

[54] CABLE CONNECTION

[75] Inventor: Ritter Friedhelm, Oberhaching, Fed. Rep. of Germany

[73] Assignee: Raychem GmbH, Ottobrunn, Fed. Rep. of Germany

[21] Appl. No.: 921,172

[22] Filed: Oct. 20, 1986

[30] Foreign Application Priority Data

Oct. 25, 1985 [GB] United Kingdom ............... 8526377

[51] Int. Cl.$^4$ .................. H01R 4/24; H01R 43/00
[52] U.S. Cl. .................... 174/84 R; 29/860; 174/75 R; 439/427; 439/874
[58] Field of Search ............... 174/84 R, 74 R, 75 R; 29/25.35, 860; 310/800; 339/100, 275 R; 439/427, 874

[56] References Cited

U.S. PATENT DOCUMENTS

| | | | |
|---|---|---|---|
| 2,970,184 | 1/1961 | Blonder | 339/100 |
| 3,951,503 | 4/1976 | Caulkins | 339/100 |
| 3,970,862 | 7/1976 | Edelman et al. | 29/25.35 |
| 4,144,404 | 3/1979 | DeGroef et al. | 174/84 R X |
| 4,339,683 | 7/1982 | Scott et al. | 310/800 X |
| 4,450,318 | 5/1984 | Scardina et al. | 174/84 R |
| 4,609,845 | 9/1986 | Soni et al. | 29/25.35 X |
| 4,629,925 | 12/1986 | Booth et al. | 310/800 X |

FOREIGN PATENT DOCUMENTS

| | | | |
|---|---|---|---|
| 1234159 | 6/1971 | United Kingdom | 339/100 |
| 2012519 | 7/1979 | United Kingdom | 310/800 |
| 2150345 | 6/1985 | United Kingdom | . |
| 2150346 | 6/1985 | United Kingdom | . |

Primary Examiner—Morris H. Nimmo
Attorney, Agent, or Firm—Simon J. Belcher; Herbert G. Burkard

[57] ABSTRACT

A cable connection is described. It is particularly suitable for a piezoelectric cable which has a low melting point conductor. The connection is made by inserting a conductive piercing member such as a wire (14) into the conductor (4), so as to leave a portion of the piercing member extending from the cable. The piercing member (14) is then heated to the softening temperature of the cable conductor (4) to allow local softening of the conductor. The result, on cooling, is a solder joint between the piercing member and the cable conductor.

11 Claims, 2 Drawing Sheets

CABLE CONNECTION

This invention relates to a cable connection, and particularly, though not exclusively to connection to a coaxial cable, which may be a piezoelectric cable.

In order to splice two cables together or to put a connector on to the end of one cable, it is usual to remove surrounding electrical insulation material from the conductor and to connect on to the exposed conductor. However, such a standard technique can give rise to difficulties with some forms of cable, for example where the integrity of the conductor is unsufficient so that this is necessarily enhanced by the insulation and/or other radially outer components of the cable. Another example arises where the insulation material itself is insufficiently robust such that exposure thereof and/or removal of an outer protective component of the cable could be detrimental to the subsequent performance of the cable.

Examples of cables that require particular care in their connection are given in UK patent publication Nos. 2150345 A and 2150346 A the entire disclosures of which are herein incorporated by this reference. These publications disclose a piezoelectric cable that comprises a central stretchable electrical conductor, a piezoelectric intermediate layer, and an outer electrical conductor. Preferably the intermediate layer is formed from polyvinylidine fluoride that has been axially stretched and radially polarized to render it piezoelectric. The central conductor is preferably formed from a low melting point metal alloy, and is thus itself in the nature of a solder. Difficulties may be experienced when making an electrical connection to such a cable, and in particular to the central conductor, due to the mechanical softness and low melting point of the conductor, and the susceptibility of the piezoelectric insulation material to creeping, due to the fact that it is stretched but not cross-linked. In particular, crimping techniques or potting with an electrically conductive adhesive may not always give satisfactory results. Furthermore, since the these cables the insulating material is much stronger than the inner conductor, it can be difficult in any case to strip the insulation without removing part of the inner conductor at the same time.

It is an object of the present invention to provide a method of forming a cable connection, and a cable connection itself, that overcome or at least alleviate the above-mentioned problems.

In accordance with one aspect of the present invention, there is provided, a method of forming an electrical connection to an electric cable having a conductor surrounded by electrical insulation material, wherein (i) a conductive piercing member is inserted into the conductor so as to leave a portion of the piercing member extending from the cable, (ii) the piercing member is heated to at least the softening temperature of the conductor, thereby to produce local softening of the conductor, and (iii) allowing the piercing member and the conductor to cool, to form a solder joint therebetween.

It has been found advantageous to achieve a soldered joint in order to ensure low resistance at the connection and to ensure maintenance of the connection under tension and vibration. A good soldered joint is obtained when an intermetallic interference layer of about one micron thickness is formed between the two materials being connected together.

Preferably, the heating of the piercing member is effected before it is inserted into the conductor, so that pressure of the hot piercing member on the conductor allows local softening of the conductor and facilitates insertion of the piercing member. It is envisaged, however, that the piercing member and conductor may be such that the piercing member may be inserted into the conductor, with heat subsequently being applied to the piercing member, by conduction or induction heating for example, to effect the local softening and subsequent soldering.

Electric cables having sodium as a conductor, which has a melting point of 97.8° C., are known, for example from British patent specification No. 1234159, whereby connection is made to the conductor by means of a tapered copper conducting member that is forced axially into the sodium. The connection is subsequently sealed within a heat shrinkable plastics insulating tube. However, no heat is applied to effect softening of the conductor to produce a soldered connection.

With the method of the present invention, therefore, the heated piercing member softens and may even melt the conductor at least locally, and so can be introduced into the cable, preferably longitudinally of the conductor, for a length sufficient to ensure good electrical contact between the piercing member and the conductor, that is to say, with low electrical contact resistance therebetween. It will be appreciated that the piercing member will be sufficiently rigid at the softening or melting temperature of the conductor for such insertion to take place. Furthermore, the temperature should clearly not be so high that the cable insulation or other components are damaged thereby.

The cable may be a piezoelectric cable, that is to say a cable having a dielectric with piezoelectric properties.

The piercing member extending from the cable conductor can then be connected to another cable, which may or may not be of the same configuration as said cable, or to a cable connector as required, by any suitable means, which may be any of the conventional conductor connection means such as soldering or crimping. The piercing member may be a short pin, or may be an elongate conductor. The present invention thus conveniently converts a cable that requires particular care in connecting thereto into a cable to which conventional connecting techniques can be applied.

In accordance with a further aspect of the present invention, there is provided an electric cable comprising a conductor surrounded by electrical insulation material, and a piercing member retained within the conductor and extending from the cable, wherein the softening temperature of the conductor is below that of the piercing member, and the conductor and piercing member are soldered together.

Preferably, and particularly when the cable is as disclosed in above-mentioned patent publications 2150345 A and 2150346 A, the conductor comprises a low melting point metal alloy. Preferably the conductor has a melting point of not more than 170° C., more preferably not more than 160° C., and most preferably not more than 150° C. Also, it is preferred for the conductor to have a melting point of at least 50° C., more preferably at least 60° C., particularly at least 65° C. and most preferably at least 70° C. The conductor may be formed from an alloy having a eutectic composition, thus exhibiting a single, well-defined melting point, but it may also be formed from a non-eutectic alloy, thus entering a phase between the solidus and liquidus lines of its phase diagram in which its ductility increases with temperature. Clearly, the conductor does not need to melt completely, or even at all, in order that the piercing member can be inserted therein, but it must become sufficiently soft to allow this to occur. The conductor, however, advantageously should not fracture. Should fracture occur, either during the stretching operation that is used in the cable formation, described in the above-mentioned publications, or during insertion of the piercing member, voids may appear. Although voids are generally undesirable, it will be appreciated that the present invention allows their adverse effect on electrical contact to be overcome, at least to an appreciable extent. The electrical contact between the piercing member and the conductor can conveniently extend over a significant distance, say up to 10 mm, so that the effect of voids occurring locally may be negligible on the contact resistance. It will be noted that this may not be so with a crimp connection, which unknowingly could be made at a part of the cable that contains a significantly large void. Electrical contact with the cable conductor can be further improved by coating the relatively high melting point material, such as high strength copper alloy, of the piercing member with the same material as that used for the conductor, thus acting as a flux. In this case, the fluxed piercing member may be heated until the flux is seen to start to melt, thus conveniently indicating that the member has reached a high enough temperature to allow it to penetrate the soft conductor of the cable.

Examples of low melting point alloys that may be used for the conductor are shown in Table 1.

TABLE 1

| Alloy Number | Components (percent by weight) | | | | | Melting Point (°C.) |
| --- | --- | --- | --- | --- | --- | --- |
| | Bi | Sn | Pb | Cd | In | |
| 1 | | 54 | 26 | | 20 | |
| 2 | 49 | 15 | 18 | | 18 | 58–69 |
| 3 | 50 | 13 | 27 | 10 | | 70–73 |
| 4 | 57 | 17 | | | 26 | 79 |
| 5 | | 42 | | 14 | 44 | 93 |
| 6 | 38 | 15 | 31 | 16 | | 70–97 |
| 7 | | 50 | | | 50 | 118–125 |
| 8 | | 51 | 31 | 18 | | 143 |

It will be appreciated that transversely of the cable, the piercing member will be smaller than the conductor, and where these are of circular cross-section, typically the diameter of the conductor may be about twice that of the piercing member.

The insulation material, as discussed above, may be piezoelectric material. Such piezoelectric material may include nylon materials having an odd number of carbon atoms, especially nylon 5, nylon 7, and nylon 11, polyhydroxybutyrate, vinylidine cyanide/vinyl acetate copolymers and vinylidine fluoride polymers. The term "vinylidine fluoride polymer" is intended to include polyvinylidine fluoride, commonly abbreviated to "PVDF" or "PVF$_2$" and those copolymers of vinylidine fluoride in which a piezoelectric activity may be generated or enhanced by orientation.

Suitable copolymers include copolymers and terpolymers of vinylidine fluoride with vinyl fluoride, trifluoroethylene, tetrafluoroethylene, vinyl chloride, and chlorotrifluoroethylene. In addition, blends of vinylidine fluoride polymers with other polymers, e.g. polymethylmethacrylate, are included provided that the piezoelectric activity thereof is not destroyed. Preferably the piezoelectric material comprises a vinylidine fluoride polymer, more preferably polyvinylidine fluoride and especially it consists substantially solely of polyvinylidine fluoride. However, not only piezopolymeric materials are suitable, but also piezo ceramic materials, such as those disclosed in UK Pat. No. 2012519, dispersed as a powder in a matrix of polymer, such as neoprene.

The cable may be of generally coaxial configuration, and electrical connection may be made to the outer conductor as required.

In a particularly advantageous configuration, the cable may be coaxial piezoelectric cable. More particularly the cable piezoelectric material may be PVDF or a similar material as described above, and the inner conductor may be a low melting point alloy. In such configurations, it will be appreciated that the advantages of a cable that can be screened against electromagnetic interference are very conveniently combined with a cable having piezoelectric properties, useful for intruder alarms or the like for example. In the present context, "low melting point" is understood to mean that the melting point of the conductor is lower than the melting or softening point of the insulation of the cable.

Embodiments of connecting methods and cable connections, each in accordance with the present invention, will now be described, by way of example, with reference to the accompanying drawings, in which.

Figure 1:
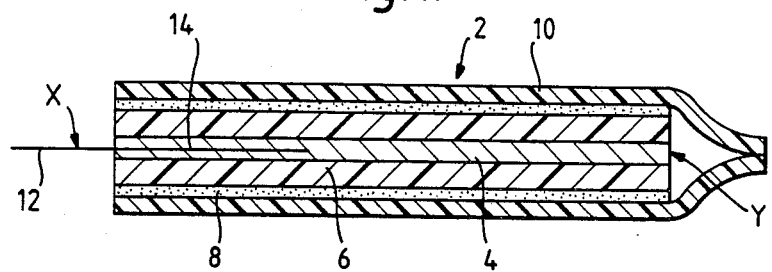
FIG. 1 shows the formation of a connection to a coaxial piezoelectric cable.

Referring to FIG. 1, a piezoelectric coaxial cable 2 comprises an inner conductor 4 formed from one of the alloys given in Table 1, an insulating layer 6 formed from polyvinylidine fluoride, an outer conductor layer 8 formed from silver paint, and an outer protective heat shrinkable polymeric jacket 10 formed from polyethylene. Although not shown in FIG. 1, the cable 2 may optionally be provided along its length with an outer polymeric jacket on top of its outer electrode 8, such jacket being formed from polyvinylidine fluoride, polyethylene, ethylene vinyl acetate copolymers and the like. The outer electrode 8 has been removed to expose a portion of the insulating layer 6. However, because of the brittle nature of the inner conductor 4, the insulating layer 6 has been left intact so that only the face of the conductor 4 at the end of the cable 2 is exposed.

The outer diameter of the outer conductor 8 is about 1.5 mm, and the diameter of the solid inner conductor 4 is about 0.5 mm. A high strength solid copper alloy wire 12 of 0.2 mm to 0.25 mm diameter is coated at one end 14 with a flux layer of the low melting point material used to form the inner cable electrode 4. The wire end 14 is heated to a temperature at which the flux is seen to start to melt, such that it can be inserted longitudinally into the inner conductor 4 of the cable 2 for a distance of 3 mm to 5 mm from its exposed end face by causing local melting of the conductor 4 around the wire end 14.

A portion of cable similar to the cable 2 of FIG. 1 was subjected to a cyclical ageing test during which the cable was maintained at −55° C., for one hour, raised to +75° C. in about 20 seconds, and maintained at the higher temperature for a further hour. After this cycle, cooling was quickly effected to −55° C., and the cycle repeated. The resistace of the inner conductor 4 and the inserted wire 12 over a 50 mm length from a point X (FIG. 1) just outside the cable to a point Y at the other end was measured at the start, after 66 cycles, and again after 86 cycles. This was done for eight samples, and the test results are given in Table 2 below.

TABLE 2

| Sample Number | Resistance at start (m.ohm) | Resistance after 66 cycles (m.ohm) | Resistance after 86 cycles (m.ohm) |
|---|---|---|---|
| 1 | 34 | 36 | 36 |
| 2 | 43 | 40 | 40 |
| 3 | 40 | 45 | 43 |
| 4 | 35 | 35 | 37 |
| 5 | 43 | 45 | 45 |
| 6 | 36 | 37 | 39 |
| 7 | 39 | 38 | 38 |
| 8 | 36 | 39 | 38 |

It is seen from Table 2 that no significant change in resistance is detected in any of the samples even after 86 cycles of the strenuous thermal cycling test, using the connection of the present invention. Tests with a crimp connection, radially through the insulation and on to the inner conductor of a cable of similar construction to that of cable 2 show a very significant increase in resistivity during such a test, indicating that a crimp connection tends to work loose under such thermal shock testing, this clearly being undesirable. The test results of Table 2 fully support the belief that soldering of the wire 12 to the conductor 4 has been effected along substantially the whole length of the inserted wire portion 14. Furthermore, under a loading test in which the cable 2 was supported and a gradually increasing load was attached to the wire 12, the soldered joint remainded intact so that the wire did not pull out even at high loadings. Ultimately, under a load of 20 Newtons, the wire 12 broke. In some samples this occurred outside the cable 2, in other samples this occurred inside the conductor 4 of the cable 2.

Figure 2:
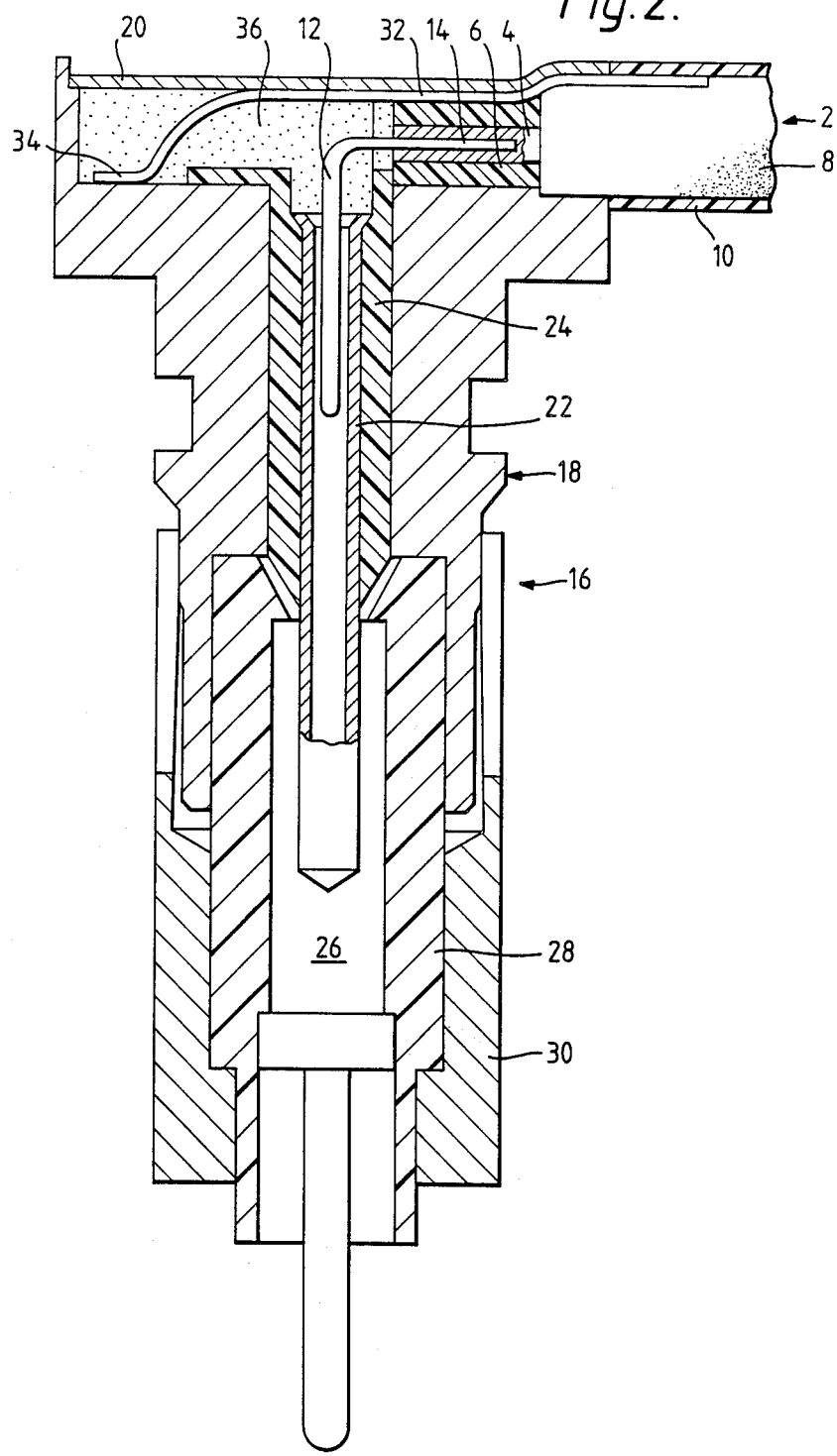
FIG. 2 shows in partial section the connection of the piezoelectric coaxial cable of FIG. 1 to a metal connector.

The cable 2 of FIG. 1 is shown in FIG. 2 with a connector 16 attached thereto. The connector 16 comprises an elongate brass housing 18 and a cover 20 that fits thereinto, and is so arranged that an L-shaped connection is formed to the cable 2. However, it will be appreciated that with only slight modifications an in-line connection may easily be achieved if such a configuration were required. Thus, the cable 2 is arranged to sit in the housing 16 with the flexible wire 12 bent through 90° of arc after leaving the conductor 4 and is crimped and/or soldered into a hollow brass pin 22 that is located in an insulating plastics liner 24 mounted in the housing 18. The pin 22 engages with a further electrical contact 26 that extends from the housing 18 and that is retained with an insulating plastics insert 28 within an end portion 30 of the brass housing 18.

A stranded copper conductor 32 is connected at one end to the outer conductor 8 of the piezoelectric cable 2 by a silver coated adhesive, and extends into the connector 16 to be soldered at 34 to the brass housing 18. The space within the connector 16 around the conductors 12 and 32, and around the end face of the cable 2 is filled with an electrically insulating potting compound 36. The connector lid 20 is placed into its recess in the housing 18, which is then flanged over, thereby securely clamping the cable 2 within the connector 16. Accordingly, not only is strain relief provided for connection to the cable 2, but the cable 2 can now be conveniently and safely connected into an electrical circuit or to other electrical equipment. To this end, it is to be noted that the connector contact 26 and housing 18, insulated from each other by the components 22 and 28, continue the electrical paths from the inner and outer conductors 4 and 8 respectively of the piezoelectric cable 2. The connector 16 may be plugged in to other equipment, or electrical leads may be taken therefrom to a printed circuit board, for example Flexprint, as required. One application of a cable such as cable 2 is in an intruder alarm, and the connector 16 may be connected to a suitable detection circuit.

Figure 3:
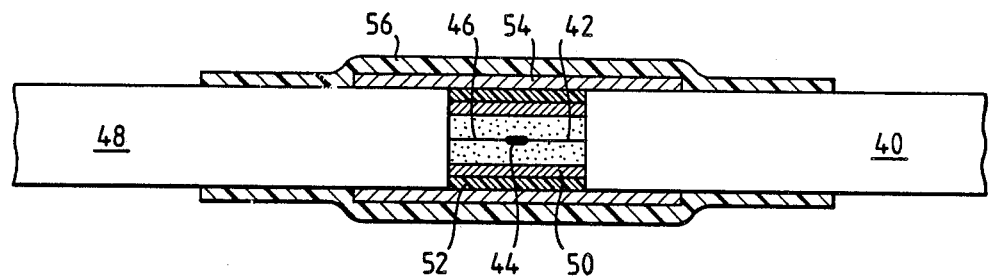
FIG. 3 shows a section through a splice between two piezoelectric coaxial cables.

Referring to FIG. 3, a piezoelectric coax cable 40 of the same configuration as cable 2 has a copper wire 42 extending from an inner electrode (not shown) thereof. The wire 42 is soldered at 44 to the extended central conductor 46 of a further coax cable 48. The coax cable 48 and the conductor 46 may correspond to the cable 40 and wire 42, but may alternatively be a standard coax cable wherein the conductor 46 is an extension of the solid copper conductor thereof. An inner metal tube 50 surrounds the soldered joint 44, and the space therewithin is filled with adhesive. The tube 50 is then enclosed with an insulating heat shrinkable polymeric sleeve 52. An outer metal tube 54 extends between the outer electrodes of the cables 40 and 48 to continue the shielding therebetween, and this is enclosed within a further insulating heat shrinkable polymeric sleeve 56 to complete the cable splice.

Figure 4:
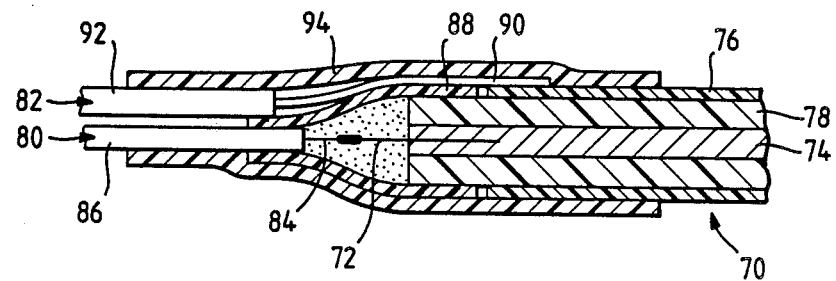
FIG. 4 shows a section through a splice between one piezelectric coaxial cable and two separate copper-cored cables.

FIG. 4 shows a further splice involving a coax cable 70, which may be a piezoelectric cable, that has a high strength conductor 72 soldered into a low melting point inner conductor 74. The cable outer conductor 76 is cut back to expose an end of the cable insulation 78. It is required to splice the conductors of the cable 70 to respectively conductors of two single wire cables 80 and 82.

The cable 80 comprises a solid copper conductor 84 enclosed within and extending from polyvinylchloride (PVC) insulation 86. The conductors 72 and 84 are soldered together and encased within an epoxy insulating adhesive. A heat shrinkable insulating polymeric protective sleeve 88 is recovered over the solder joint, and extends on to the insulation 78 and 86 of the cables 70 and 80 respectively. The cable 82 comprises a stranded copper conductor 90 and PVC insulation 92. The conductor 90 is exposed at one end of the cable 82 and the strands are splayed out and secured by adhesive around about 50% of the curved surface of the outer conductor 76 of the coax cable 70. The splice is completed by recovery of an outer heat shrinkable insulating polymeric sleeve 94 that extends around the outer conductor 76 (and any outermost protective cable jacket thereon) of the coax cable 70, across the soldered and adhesive joints, and around the insulating jackets of each of the cables 80 and 82, thereby to provide electrical protection and mechanical protection, including strain relief, of the cable connections.

It will be appreciated that although several embodiments of cable connection in accordance with the present invention have been described, other configurations may be adopted to suit particular circumstances. For example, it is envisaged that where two or more cables each in accordance with the present invention and of coaxial configuration are to be connected to respective ones of other cables, it may be desirable or convenient to connect together all of the outer conductors, for connecting to a single earthing conductor for example. The other cables may also be in accordance with the present invention, may be conventional coaxial cables, or may be flat cables, for example.

I claim:

1. A method of forming an electrical connection, comprising:
   (i) providing an electric cable having a conductor with a softening temperature surrounded by electrical insulation material, and a conductive piercing member,
   (ii) inserting the piercing member into the conductor of the cable so as to leave a portion of the piercing member extending from the cable,
   (iii) heating the piercing member to at least the softening temperature of the conductor so as to produce local softening of the conductor, and
   (iv) allowing the piercing member and the conductor to cool so as to form a solder joint therebetween.

2. A method according to claim 1, wherein the step of heating the piercing member is effected before the step of inserting it into the conductor.

3. A method according to claim 1, wherein in the step of inserting the piercing member, the piercing member is inserted into the conductor substantially longitudinally therealong at the end of the cable.

4. A method according to claim 1, further comprising making electrical connection to that portion of the piercing member extending from the cable.

5. An electrical connection between an electric cable and at least one other cable, the electric cable comprising a conductor having a softening temperature surrounded by electrical insulation material, and having a piercing member with a softening temperature retained within the conductor and extending from the electric cable, wherein the softening temperature of the conductor is below that of the piercing member, and the piercing member is soldered at one end thereof to the said conductor and is connected towards another end thereof to a conductor of the said at least one other cable.

6. An electrical connection according to claim 5, wherein the piercing member extends substantially longitudinally along the conductor.

7. An electrical connection according to claim 5, wherein the conductor has a melting point of not more than 170° C.

8. An electrical connection according to claim 7, wherein the melting point of the conductor is in the range of from 50° C. to 150° C.

9. An electrical connection according to claim 5, of coaxial configuration.

10. An electrical connection according to claim 5, wherein the cable is a piezoelectric cable further comprising an outer electrical conductor, and wherein the insulation material is piezoelectric.

11. A connection according to claim 5, wherein the or at least one other cable comprises a piezoelectric cable.

* * * * *

UNITED STATES PATENT AND TRADEMARK OFFICE
CERTIFICATE OF CORRECTION

PATENT NO. : 4,786,760

DATED : November 22, 1988

INVENTOR(S) : Friedhelm Ritter

It is certified that error appears in the above-identified patent and that said Letters Patent is hereby corrected as shown below:

On the Title Page, under Item [19], "Friedhelm" should be --Ritter--;

Item [75], "Ritter Friedhelm" should be --Friedhelm Ritter--.

Column 1, line 43, "the" (first occurrence) should be --with--.

Signed and Sealed this

Fourth Day of April, 1989

Attest:

DONALD J. QUIGG

Attesting Officer

Commissioner of Patents and Trademarks